United States Patent [19]

O'Connor et al.

[11] Patent Number: 5,131,535

[45] Date of Patent: Jul. 21, 1992

[54] ELECTRICAL DEVICE TRANSPORT MEDIUM

[75] Inventors: Bruce O'Connor; Steve Swendrowski; Thomas Toth, all of San Diego County, Calif.

[73] Assignee: SymTek Systems, Inc., San Diego, Calif.

[21] Appl. No.: 666,559

[22] Filed: Mar. 7, 1991

Related U.S. Application Data

[63] Continuation of Ser. No. 511,851, Apr. 20, 1990, abandoned, which is a continuation of Ser. No. 879,307, Jun. 27, 1986, abandoned.

[51] Int. Cl.⁵ .............................................. B65D 73/02
[52] U.S. Cl. ................................... 206/329; 206/332; 206/480; 206/486; 206/560; 174/52.4; 439/70
[58] Field of Search ................................ 206/328–332, 206/334, 558, 560, 477, 480, 483, 486, 488, 490; 439/68–73, 76, 329, 350, 353, 372, 544, 547, 554, 564, 567, 571, 572; 174/52.4; 198/803.8, 803.14, 803.15; 361/400, 401; 324/158 F

[56] References Cited

U.S. PATENT DOCUMENTS

| | | |
|---|---|---|
| 3,444,993 | 5/1969 | Lunsford . |
| 3,454,921 | 7/1969 | Coleman et al. ............... 206/331 X |
| 3,653,498 | 4/1972 | Kisor ............................. 206/331 X |
| 3,673,543 | 6/1972 | Garner . |
| 3,723,943 | 3/1973 | Hotze ............................ 439/72 |
| 3,772,573 | 11/1973 | Triplett et al. . |
| 3,809,233 | 5/1974 | Gruszka . |
| 3,892,312 | 7/1975 | Tems ............................. 206/328 |
| 3,900,239 | 8/1975 | Anhalt et al. ................. 439/73 |
| 4,012,608 | 3/1977 | Lockard . |
| 4,015,707 | 4/1977 | Kisor . |
| 4,210,243 | 7/1980 | McDowell . |
| 4,351,580 | 9/1982 | Kirkman et al. ............ 174/52 FP X |
| 4,390,220 | 6/1983 | Benasutti ....................... 439/71 |
| 4,417,777 | 11/1983 | Bamford ........................ 439/70 |
| 4,442,938 | 4/1984 | Murphy . |
| 4,448,306 | 5/1984 | Sinnadurai et al. ............ 206/331 |
| 4,483,442 | 11/1984 | Worth . |
| 4,549,843 | 10/1985 | Jagusch et al. ................. 206/328 X |
| 4,598,821 | 7/1986 | LaBarbara et al. ............. 206/329 |
| 4,619,431 | 10/1986 | Matsui et al. .................. 174/138 G X |
| 4,657,137 | 4/1987 | Johnson . |
| 4,682,270 | 7/1987 | Whitehead ...................... 361/401 |
| 4,693,370 | 9/1987 | Aceti .............................. 206/488 |
| 4,711,351 | 12/1987 | Zucker et al. ................... 206/331 |

FOREIGN PATENT DOCUMENTS 3048429 7/1982 Fed. Rep. of Germany ...... 206/328

Primary Examiner—Bryon P. Gehman
Attorney, Agent, or Firm—Thomas J. Tighe

[57] ABSTRACT

A transport medium for orderly, in-process transportation of assembled electrical devices during backend processing. A carrier tray is comprised of a plurality of carrier units held in coplanar relationship by a frame. Preferably the carrier units are polyethersulfone inserts latchable into a coordinate matrix of carrier unit holes defined by a metallic sheet. Each carrier unit carries one or more electrical devices in device seats which expose a top and a bottom of each device sufficiently to eliminate any necessity for removing the devices from the medium during all backend processing. Each carrier unit has a standardized perimeter but a core which is adapted to a particular device size and form, and there can be as many different carrier units as there are different device forms and sizes, but all carrier units fit into a standard carrier unit hole. The frames and carrier units are robotically manipulable. Each tray, each carrier unit and each device in a carrier unit are uniquely identifiable by a combination of bar code indicia on the frame and a series of indexing holes along the frame perimeter and centered on each line of carrier units.

18 Claims, 4 Drawing Sheets

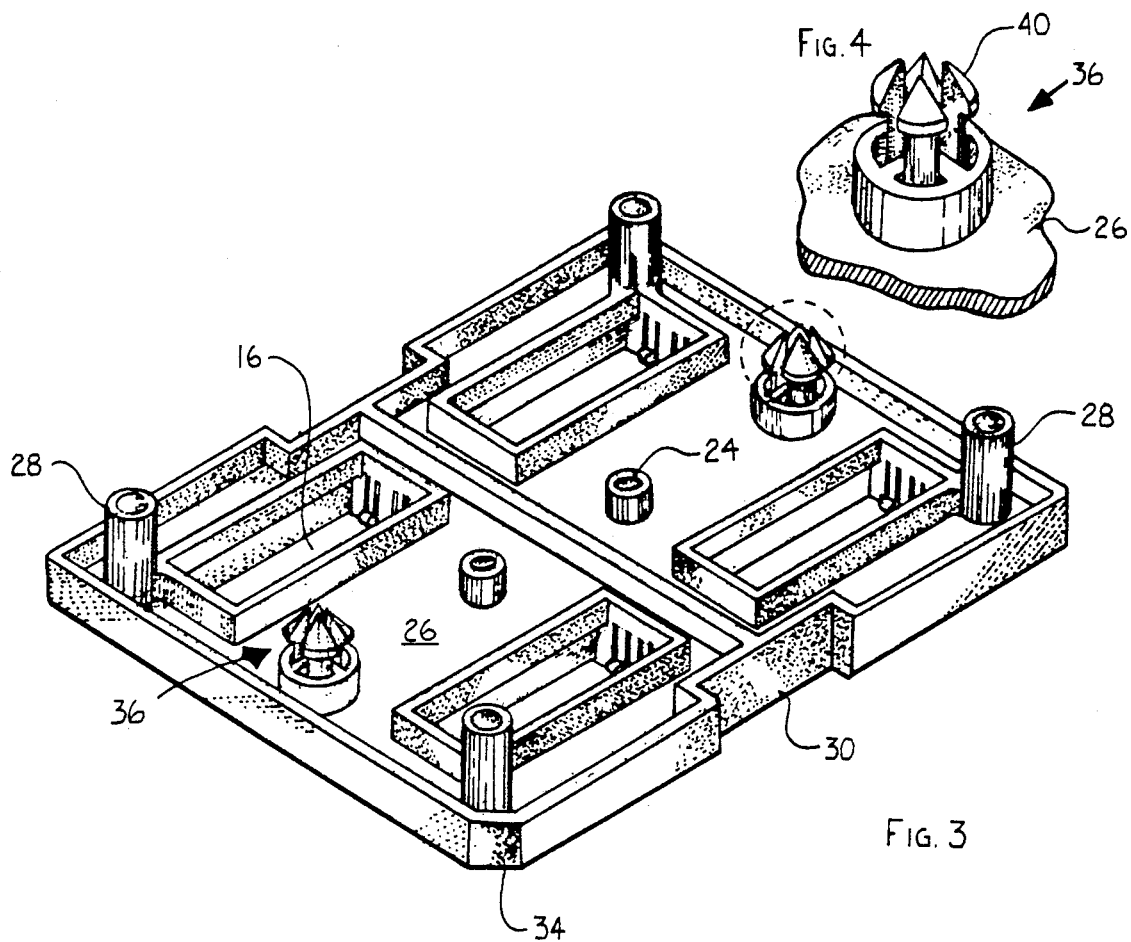
Fig. 4
Fig. 3
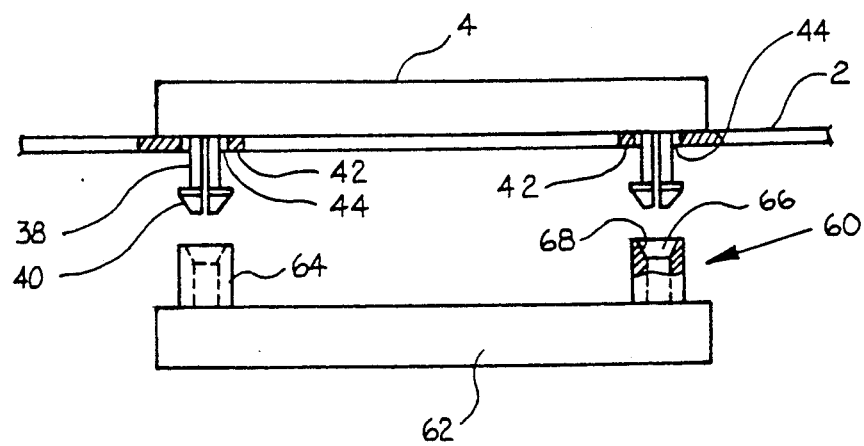
Fig. 8

ELECTRICAL DEVICE TRANSPORT MEDIUM

This is a continuation of application Ser. No. 07/511,851, filed Apr. 20, 1990 now abandoned, which is a continuation of application Ser. No. 06/879,307, filed Jun. 27, 1980, now abandoned.

BACKGROUND OF THE INVENTION

This invention relates generally to means for transporting electrical devices, and in particular to media for the in-process transportation of electrical devices.

As used herein, the term "electrical device" shall refer to and mean semiconductor devices, integrated circuit devices, hybrid devices and the like. As used herein, the term "backend processing" shall refer to and mean all of the heating, cooling, testing, sorting, marking and other processes which an electrical device undergoes from the time it is assembled to the time it is ready for shipment to a customer.

Generally, assembled electrical devices are transported through the various backend processing machines in one of two ways. One is known as "naked" handling, where no type of electrical device protection or handling standardization is used. Here, the devices are fed "as is" to a processing machine from a transport medium known as a tube. One tube generally holds 15 to 30 devices depending on the device size. The devices are stacked in the tubes. A typical tube contains twenty-seven 16-pin, 300 mil devices. Generally, the tubes are made of plastic or aluminum. They do not carry any kind of readable tracking identification indicia and are hand-carried, typically in a box or tote, from process step to process step. The devices must be removed from the tubes for each process step on a per machine basis. When a machine has completed a process step (or steps), the devices are returned back into a tube (probably a different tube) to be carried to the next process step. Information containing the results of the last and all previous process steps is usually recorded by hand on a piece of paper (traveler) and is transported with each group (lot) of tubes.

Such conventional processing technology, therefore, is very labor intensive. In large manufacturing facilities workers are needed to transport the tubes of devices from process step to process step. In fact, manufacturing lot sizes are typically limited to the number of devices that one operator can carry by hand. Many times, the integrity of the results of a process step is dependent on where the operator places a tube of processed devices. Misplacing a tube can easily compromise the integrity of a lot. In addition, information associated with the lot is usually carried on paper with the devices and must be hand entered at each process step by the operator. This requires additional skilled operators and further allows for human error to be introduced.

Other problems with conventional backend processing are associated with loading and unloading the devices in tubes for each process step. Naked handling allows mechanical defects (bent leads, chips, etc.) and electrostatic discharge failures. Bent leads, in turn, can cause the various process machines to jam up.

Further problems are associated with the processing machines themselves. Since each machine must unload and reload the devices into the tubes, each machine must be adapted to a particular device form. Besides the expense of having such device specific machines, such adapted machines are quite prone to failure, (e.g. jams, mis-processing) due to minor fluctuations in device form and wear associated with high volume handling. Furthermore, the electrical devices manufacturer is burdened by having to maintain various pieces of equipment that are dedicated to a particular device package form.

The other method incorporates the use of a "carrier". The devices are placed in a plastic frame to protect the contact leads and to provide limited handling standardization. These carriers, with the devices installed, are also fed to the machines in tubes.

Carriers reduce mechanical defects and reduce package specific handling to some extent. But, carriers still cause jams due to wearing of the relatively soft plastic from which the carriers are made. Furthermore, handling standardization only occurs across common package styles with similar lead counts (i.e., 14-18 lead DIP's or 68-88 lead PGA's).

Backend processing by this invention eliminates the tube. In the preferred embodiment as will be described, the electrical devices, up to 256 of them, are latched into seats defined by a planar tray, the seats being coordinately arranged, such as in a standard X-Y format. The tray is the common transport medium for the devices to and from all processing equipment, and during all processing. Preferably the seats of a tray can be configured to accomodate a wide variety of device package forms, while not changing the outside dimensions of the tray. This standardizes the processing equipment and minimizes their dependence on changing package types.

The devices are loaded into a tray one time and then the tray is used as the transport medium throughout the backend processing. This eliminates the need to handle the devices individually at each process step and thereby standardizes the equipment and greatly improves their reliability. The possibility of damage to the devices is vastly reduced as they are never touched by human hands, and the number of machine insertions are reduced to a minimum because full trays of devices are inserted rather than individual devices. Also, since each device in a tray occupies a unique position in a coordinate system, each device can be uniquely identified at each process step. Thus, the traceability and reliability of device process information is vastly improved over conventional methods.

This invention will allow an electrical device manufacturer to totally automate his or her line with minimal set-up changes to run a wide variety of products. The devices can be automatically conveyed to their appropriate process steps under the direction of a process control system. Then they can be loaded and unloaded using a mechanism such as an automated loading arm. The load arm might consist of an X-Y-Z positioning matrix, or it might be a commercially available robot arm. Lot sizes can be optimized to implement a just-in-time approach to manufacturing. Material queues can be reduced through faster set-up times and line flexibility.

Other advantages and attributes of this invention will be discussed in, or will be readily discernible upon a reading of, the text hereinafter.

SUMMARY OF THE INVENTION

This invention presents a transport medium for the orderly in-process transportation of electrical devices, which medium comprises a plurality of carrier units, each carrier unit being adapted to carry at least one device such that a top and bottom of each device is exposed; and a frame means adapted to hold the carrier units in a generally coplanar relationship. Preferably the frame means includes integral means for making it robotically manipulable. Preferably the frame means is a metallic sheet defining a plurality of insert holes and the carrier units are inserts which are latched in the holes. The frame means and the latched carrier units form a tray. Preferably the frame means includes a support means by which a frame means resting on the lower level of a bi-level processing platform is spaced above the platform, and the latched carrier units are allowed a suitable amount of travel, normal to the frame means, such that the carrier units rest on the upper level of the platform by means of planarization posts projecting from a base of the carrier units.

An object of this invention is to provide a standardized transport medium for electrical devices to, from and during backend processing steps.

A further object of this invention is to provide a transport medium for electrical devices which, throughout the course of backend processing, can be uniquely identified and which carries the devices in such a way that each carried device can be uniquely identified.

A further object of this invention is to provide a transport medium for electrical devices which exposes a top and a bottom side of each device sufficiently to eliminate the necessity for removing the devices from the transport medium during all backend processing.

A further object of this invention is to provide a transport medium for electrical devices which can be configured to carry a wide variety (much wider than is conventionally possible) of devices of different form while maintaining as a constant the outer dimensions of the medium.

A further object of this invention is to provide a standardized, electrical device carrier (frame means) adapted to carry a plurality of subcarriers (carrier unit) with standardized perimeters, the subcarriers being configurable to carry therein a wide variety (much wider than is conventionally possible) of devices of different form, the subcarriers providing sufficient access to the devices being carried such that the devices can remain in the subcarriers throughout backend processing.

Other objects of this inventions are expressly or impliedly stated in the text of this specification.

BRIEF DESCRIPTION OF THE DRAWINGS

FIG. 3 is a perspective view of a reverse side of the carrier unit of FIG. 2.

FIG. 4 is an enlarged portion of FIG. 3.

FIG. 8 is a partial sectional view showing the removal of a carrier unit from the frame means.

DESCRIPTION OF THE PREFERRED EMBODIMENT

Figure 1:
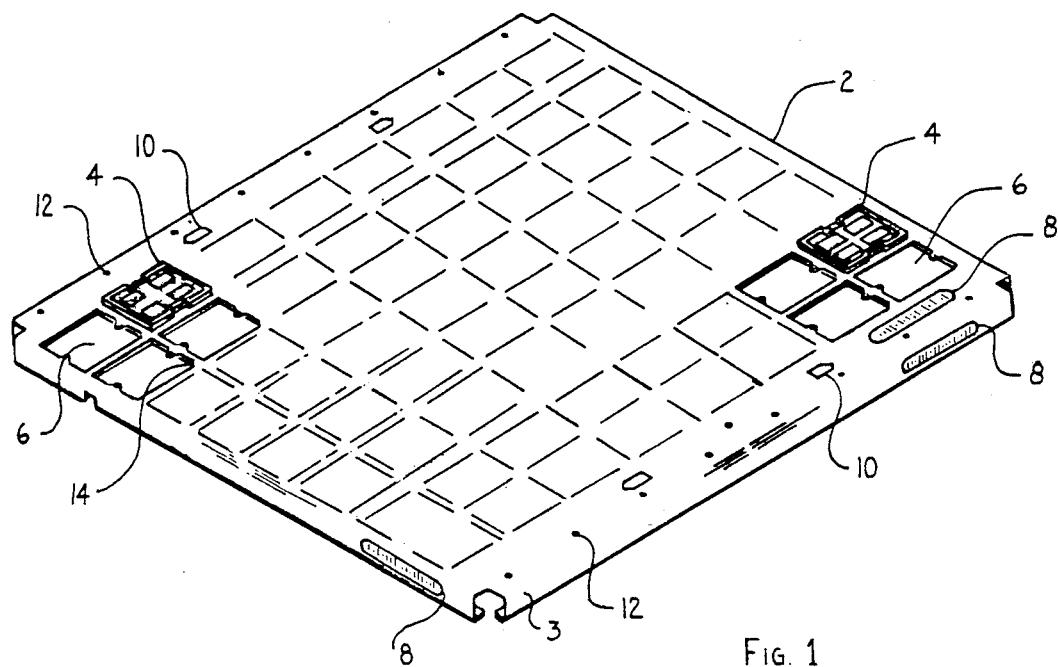
FIG. 1 is a perspective view of a frame means.

Referring to FIG. 1, a generally planar frame 2 with uniformly right-angled margins 3 is shown to carry a plurality of generally rectangular carrier units 4. The carrier units are adapted to fit into and mate with carrier unit holes 6 defined by the frame 2 and preferably arranged in rows and columns as shown. The frame also has identification indicia 8 on at least three viewing planes. Preferably the indicia comprises a computer-readable bar code in relief, in relief so that the bars do not protrude beyond the sides of the frame. Integral with the frame are means 10 for making the frame robotically manipulable, preferably said means comprise receptacle holes defined by the frame and adapted, for example, for use by a robotic end effector.

Referring again to FIG. 1, along the perimeter of the frame 2 are defined a series of uniformly disposed holes 12. The holes are disposed so as to be on the center lines of each line of carrier units. These holes 12 are preferably used for frame indexing by a process machine, that is, the carrier units are located and identified by the holes. This can be done by using some sort of a "walking beam" mechanism conventionally known. The holes 12 can also be used for frame alignment. There is also an orientation means by which the carrier units are oriented when they are put in the frames. As can be seen, the carrier unit holes 6 are generally rectangular with one corner 14 being beveled. As will be explained, said beveled corner matches and mates with a notched corner of the carrier units 4 to indicate proper orientation of the carrier units.

Figure 2:
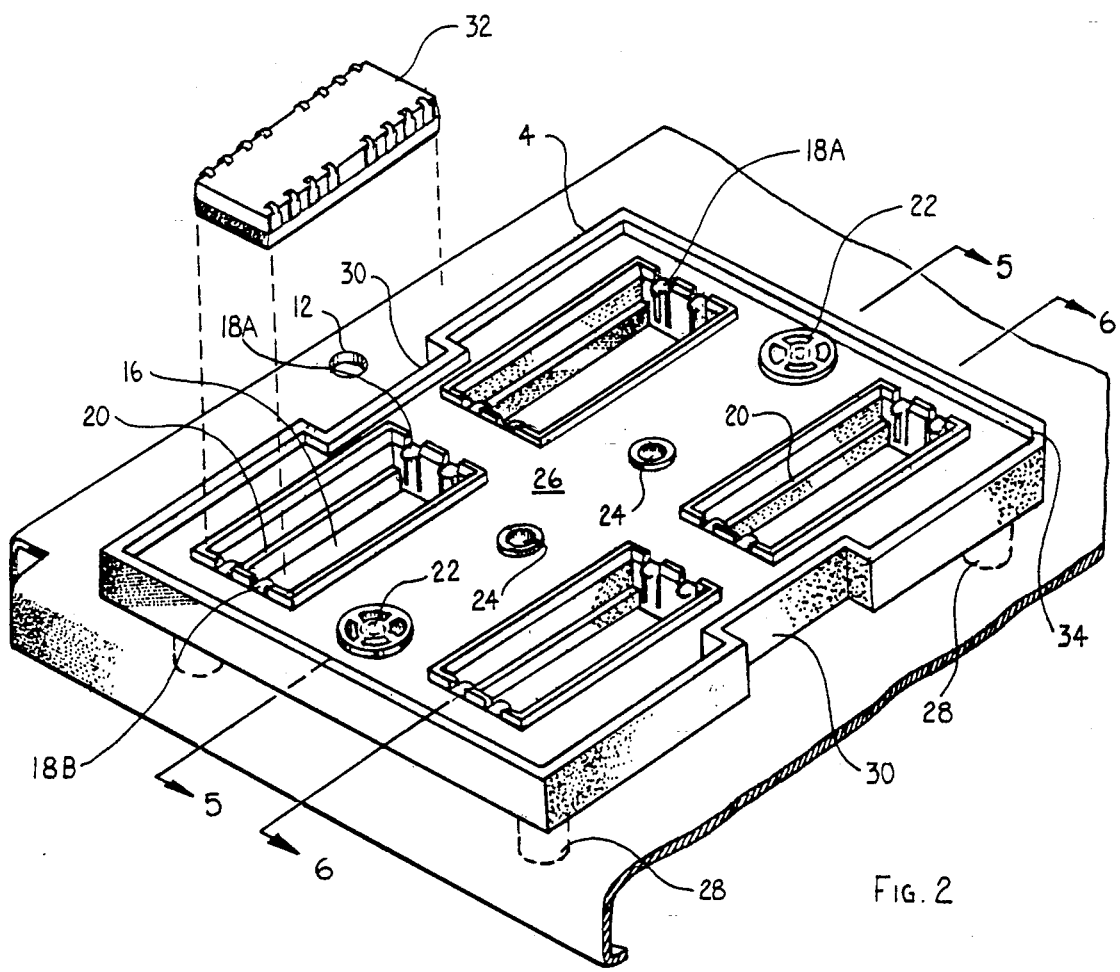
FIG. 2 is a perspective view of a carrier unit adapted to carry electrical devices, one of which is shown in exploded view.

Referring to FIGS. 2 and 3, a more detailed showing of a carrier unit 4 is presented FIG. 2 being a topside view of a carrier unit 4 disposed in a frame 2 and FIG. 3 being an underside view of the carrier unit. The carrier unit as shown in these figures defines four electrical device seats 16. Each seat comprises a sleeve open at both top and bottom, the sleeves conforming to the marginal size and form of a particular type of electrical device as will be explained. (The terms "top" and "topside", and "bottom" and "underside" as used in this specification are arbitrarily assigned to distinguish one large side from its opposite side, because all items so described can be oppositely or otherwise oriented without adversely affecting the novelty or operability of this invention.) The devices are loaded into the seats and are latched therein by a plurality of device latches 18a and 18b. The device latches are generally in the form of an inverted "L" with the base leg of the "L" being used to hook the device and hold it against a stop which is a seating plant or shoulder 20 intruding into the sleeve. Preferably two latches 18A hook one end of a device and two latches 18B hook an opposite end of the device, the latches operatively opposed to the stop to hold the device therebetween. A plurality of alignment holes 22 and 24, which are defined by sleeves protruding through a web 26, are used to precisely locate within a carrier unit the seated devices for a processing probe or marker. The web 26 is the interconnecting structure which ties seat walls, sleeves, and a carrier unit perimeter wall together in place. Projecting from a base of each carrier unit are four planarization posts 28. The purpose of the posts will be more fully explained later. The long sides of the carrier units are centrally and transversally indented to form receptacles 30 which are adapted to being gripped by a robotic end effector. The receptacles 30 provide a means by which the carrier units can be automatically loaded into a frame with conventional pick-and-place equipment or robots such as the Seiko RT-2000 or the IBM 7535 machines. An electrical device 32 having sixteen contacts or leads is shown exploded from a carrier unit seat 16 and is oriented reverse-side-up as it would be disposed within the carrier unit. The carrier unit is also shown to have a notched corner 34 which matches the beveled corner 14 of the frame. The matching of the notch and bevel indicate that the carrier unit is properly oriented within the frame.

Figure 5:
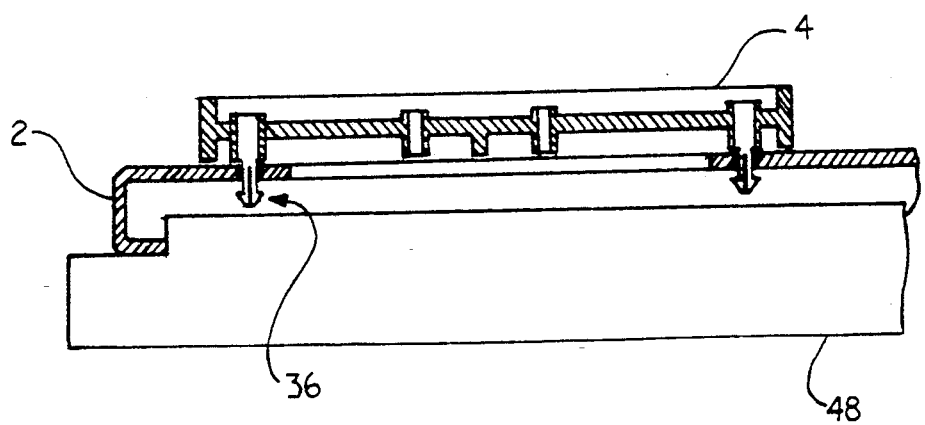
FIG. 5 is a section taken along line 5—5 of FIG. 2.

Referring to FIGS. 3 through 5, the details and use of carrier unit retention latches, generally designated 36, are shown. A plurality of resilient prongs 38 of a carrier unit retention latch 36 are uniformly and angularly spaced around an imaginary circle, each prong having an outwardly tapered barbed end 40. The prongs of each carrier unit retention latch are so disposed that they appear to be spaced-apart slats of an imaginary hollow cylinder and the barbed ends appear to be wedges of a conical arrowhead atop the cylinder, the cylinder inside diameter being an extension of the alignment hole 22. The prongs of each carrier unit retention latch are adapted to radially collapse together whenever the barbed ends are inserted into a catch hole too small for the cone of the barbed ends to freely pass through. In such a case, the taper of the barbed ends act as cams riding against the rim of the hole forcing the barbed ends of the prongs to radially move together. Once through the hole, the prongs resiliently return to their spaced-apart positions if the diameter of the hole is at least equal to the outer diameter of the prong cylinder. The resiliency of the prongs are functions of the design length of the latch beam and the prong material's flexural modulus. The fact that the inside diameter of the prongs' cylinder is an extension of alignment hole 22 saves space on the carrier unit face. The extension simultaneously provides an alignment hole and clearance for the prongs to collapse together.

Preferably, each carrier unit has a pair of integral carrier unit retention latches 36 oppositely and centrally disposed proximate the short ends of the carrier unit. When loading a carrier unit into the frame, the pair of latches are forced through a corresponding pair of catch holes 44 defined by a pair of flanges 42 integral with the frame. The flanges are extensions of the frame which project into the carrier unit hole 16. The diameter of the catch holes 44 are greater than the outer diameter of the prong cylinder but less than the largest outer diameter of the cone of the barbed ends. The barbed ends prevent removal of the carrier unit without the use of a removal tool as will be described.

The length of the prongs 38 is adapted to provide a suitable amount of carrier unit 4 travel normal to the general plane of the frame. In other words, the length of the prongs from a base of the carrier unit to the barbed end of the prongs is sufficiently greater than the thickness of the flanges 42 to enable the carrier units to effectively "float" on the frame.

Figure 6:
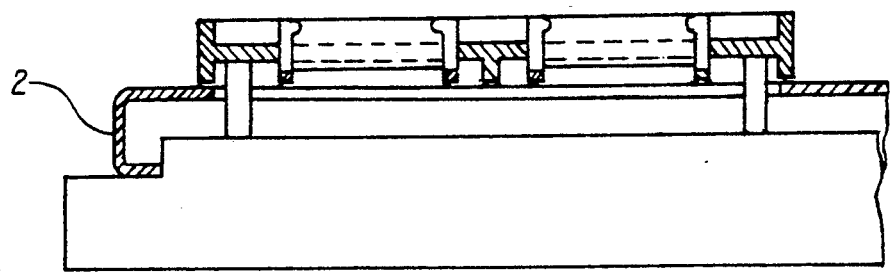
FIG. 6 is a section taken along line 6—6 of FIG. 2.

Referring to FIGS. 5 and 6, a frame 2 and a carrier unit 4 are shown to be disposed upon a bi-level process machine platform 48 having two reference planes. The frame is supported by its angled margin 3 resting upon the lower reference plane, while the amount of carrier unit travel normal to the frame is sufficient to allow the carrier unit to rest entirely on its planarization posts 28 which are resting on the upper reference plane. Preferably the differential between the upper and lower reference planes, the length of the planarization posts, and the amount of carrier unit travel are set so that when the frame is seated on the lower plane of the platform 48, all the carrier units are raised up slightly from the frame by the upper plane of the platform, approximately 0.030 inches. This brings all of the carrier units and their seated electrical devices up to a common working plane, even if the frame is slightly warped. This has the effect of precisely placing the upward facing contacts of all devices on the frame in a common plane, i.e., causing the z-axis coordinate of all of the devices to be the same even though the frame may be slightly warped. The "floating" of the carrier units with respect to the frames is particularly advantageous because the planarity of the frames need not be precisely controlled as would otherwise be the case and only the planarity of the process machines' platforms need to be tightly controlled.

To load the electrical devices, the frame could be mounted on an X-Y table and indexed under some type of insertion head containing the device to be loaded. Once a device is centered over a device seat then the insertion head pushes the device past the device retention latches, 18A and 18B, and seats it. It should be noted that the devices are totally recessed into the carrier units to virtually eliminate accidental leading bending after it is loaded. An alternative loading method would be to first retract the device retention latches with some latch retraction means on the insertion head, then simply drop the device. The latches would then spring back and retain the device after the insertion head is withdrawn. Unloading the devices can be accomplished by reversing the sequence in the aforementioned methods. The only differences are that the device would be pushed from the opposite side of the frame to overcome the device retention latch force, or a vacuum pick would be used to remove the devices in the alternative method.

Figure 7:
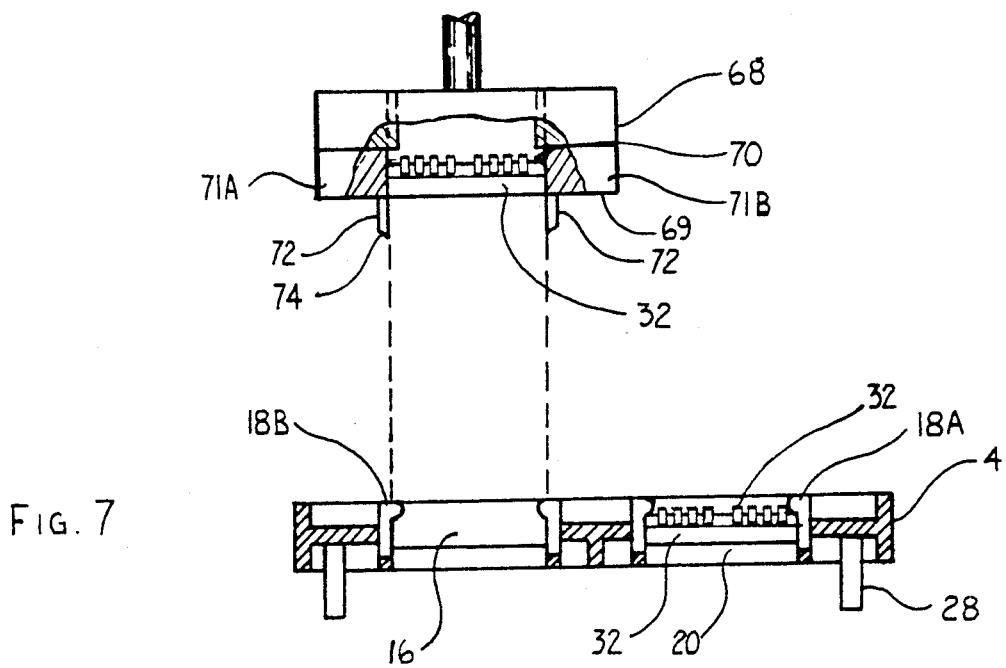
FIG. 7 is a sectional view showing the loading of a device into a carrier unit.

Referring to FIG. 7, an insertion head having a body 68 with a facing 69 is shown in the act of inserting a first electrical device 32 into a first device seat 16 while a second device is shown already seated in a second seat. The insertion head has a device-holding cavity 70 open to the facing 69 into which the device-to-be-loaded is placed with the leads of the device being generally oriented inboard for proper subsequent orientation of the device in the seat 16. In one embodiment the cavity 70 is defined by the body 68 and the device is held by a vacuum means in the cavity 70 until it is released and loaded into the seat. In a second embodiment, the cavity 70 is defined by a pair of adjustable or biased jaws 71A and 71B and the device is ejected by releasing it and allowing it to drop. Projecting normally from the facing 69 are a pair of tine means 72A and 72B, each tine having a beveled end 74. The tines are disposed at opposite ends of the device holding cavity, the ends which correspond to the device ends which will be hooked by the device latches 18A and 18B. The tines are so disposed and adapted that as the facing 69 is brought to bear against the topside of the carrier unit 4 in alignment with the seat 16, the beveled tine ends act as cams against the base legs 19A and 19B of the device latches forcing the latches to retract to allow clear passage of the device between said legs and into and out of the seat, the latches 18A and 18B being resilient and their resiliency being functions of their material's flexural modulus.

Referring to FIG. 8, a carrier unit removal tool, generally designated 60, is shown having a body 62 from which normally project a plurality of posts 64. The number and disposition of the posts 64 correspond to the number and disposition of carrier unit retention latches 36 of a carrier unit 4 being removed from a frame 2, that is, they match in number and the posts re simultaneously alignable with the latches. Each post defines at its free end a centered, inverted conical hole 66. To remove a carrier unit, the posts are brought to forcibly bear against the barbed ends 40 of the latches. The slopes 68 and the dimensions of the conical hole 66 are adapted to partially receive and force together the barbed ends sufficiently to enable the barbed ends to be pulled through the catch holes 44, and thus releasing the carrier unit from the frame.

Figure 9:
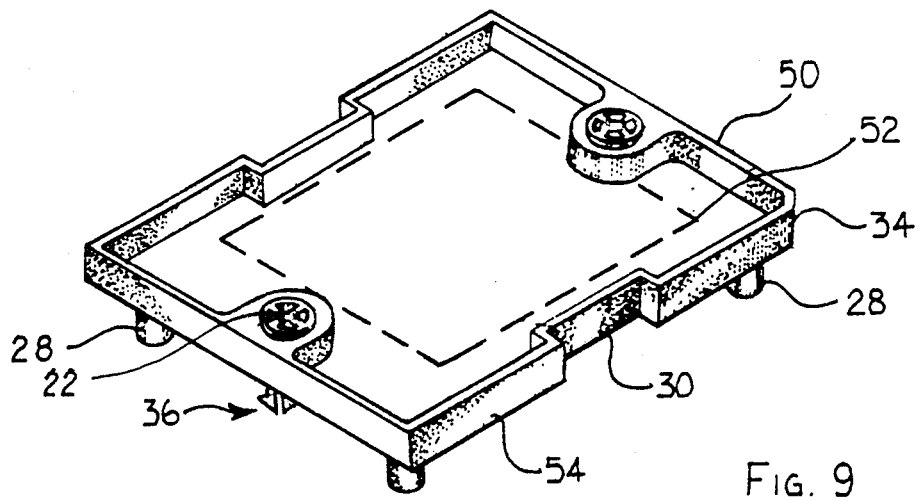
FIG. 9 is a perspective view of a standardized carrier unit perimeter.

Referring to FIG. 9, a perimeter 50 common to all carrier unit variations is shown having a personality core 52 and wall 54. A significant advantage of this invention is that a wide range of electrical device types and forms can be handled without a variation in the basic outside perimeter and retention latches of the carrier units. It is only the personality core that changes. The core of FIG. 9 is shown in blank. The dashed line 52 shows generally the area of the core which is personalizable.

Figure 10:
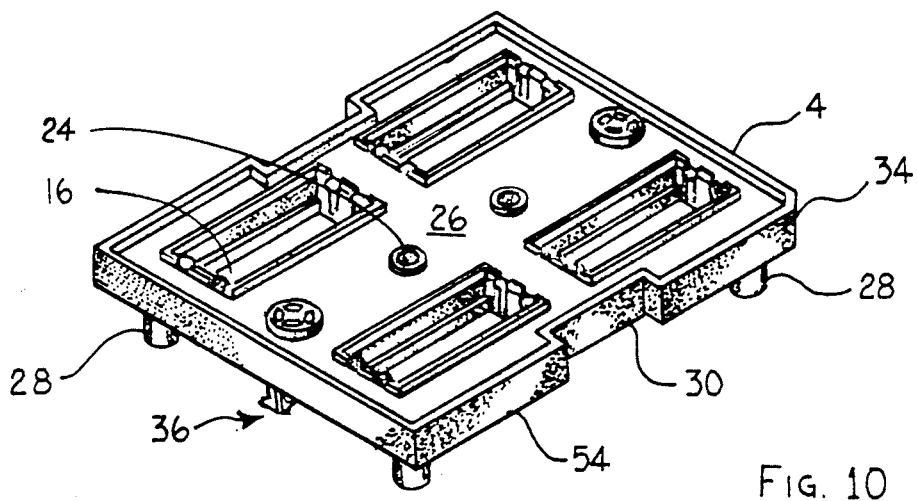
FIG. 10 is a perspective view of a carrier unit of the kind shown in FIGS. 1–3.

Referring to FIG. 10, the previously discussed carrier unit 4 is shown to illustrate that its perimeter wall 54, carrier unit retention latches 36 and planarization posts 28 are the same as those shown in FIG. 9. In this case, however, a personality core has been added comprising the web 26, the seats 16 and the alignment holes 24.

Figure 11:
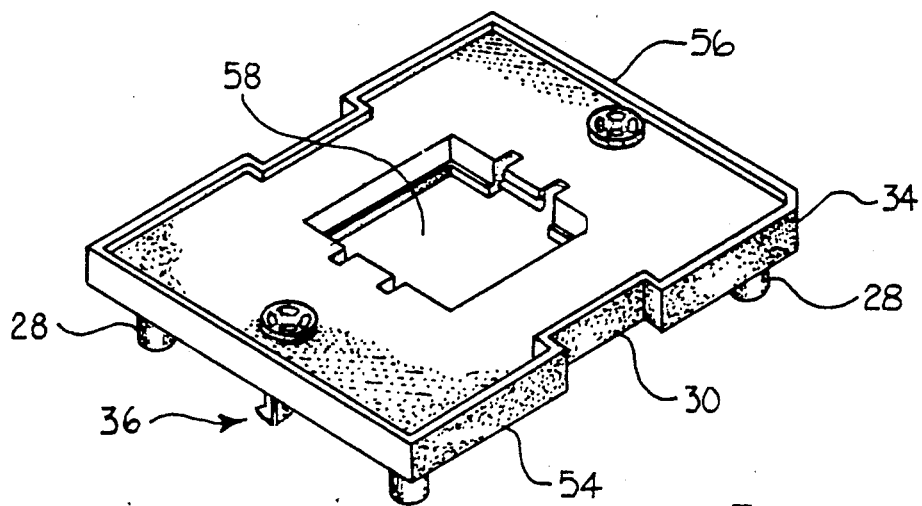
FIG. 11 is a perspective view of a carrier unit adapted for a different kind of device.

Referring to FIG. 11, a second variation 56 of a carrier unit is shown. Its perimeter, carrier unit retention latches, and planarization posts are identical to those carrier units of FIGS. 9 and 10. Only the personality core is different. It comprises a web 57 defining a single seat 58, and adapted to carry an electrical device packaged in a form commonly known as pin grid array (PGA).

It should be noted that each device set defined by a carrier unit can be open at both top and bottom so as to expose a top and a bottom side of a seated device sufficiently to eliminate any necessity for removing the device from its carrier unit during backend processing.

In a backend processing operation, a frame is set up by latching into it carrier units suitable for the form of the electrical devices which will be processed. The devices are then loaded into the carrier units and remain there throughout the processing. The frame is then transported by conveyor belt or other appropriate means to and from the steps of the processing. Access to the device can be gained both from above the frame and below. Preferably the devices are disposed in the carrier units "dead bug" fashion, that is, with their leads generally oriented upward. Processing machine contactors can thus make contact with each device from above the frame. As explained before, all of the devices' leads will be in a common plane when the frame is mounted on a process platform as shown in FIGS. 5 and 6. Thus devices may be electrically contacted singly or in multiples simultaneously. Since each frame is uniquely marked, and a device's position on the frame is constant and can be uniquely identified, processing results about each individual device can be easily and unambiguously maintained. The devices can be marked from either side of the frame. The devices are not unloaded until all process steps are completed, and at that point the unique identifiability of each device can be used to precisely sort them.

The material of the carrier units preferably is selected to resist high temperature deformities, static build up and be highly resistive. One such material is a high temperature, graphite-loaded thermoplastic known as polyethersulfone. It contains graphite fibers to drain off any static build up that can cause electrostatic discharge damage to the devices. The resistivity of the material is preferably held to between $10^9$–$10^{14}$ ohms per square inch. The high temperature properties of the polyethersulfone enable the loaded frames to carry the devices throughout all heating and cooling chambers commonly known as "soak" chambers. The material's trade name is VICTREX manufactured by ICI Americas, Inc., Wilmington, Del.

Although the preferred embodiment disclosed herein includes floating carrier units that are removably latched into the frame, it should be understood that in other embodiments the carrier units can be non-removably affixed into the frame means by rivet or other suitable means in place of the carrier unit retention latches. Furthermore it may be desireable in certain processing environments not to float the carrier units, and the carrier unit retention latches can be shortened to eliminate the floating travel, or the carrier units can be otherwise affixed to the frame by bolt, rivet or other suitable means. Furthermore, the carrier units can be an integral part of the frame.

The foregoing description and drawings were given for illustrative purposes only, it being understood that the invention is not limited to the embodiments disclosed, but is intended to embrace any and all alternatives, equivalents, modifications and rearrangements of elements falling within the scope of the invention as defined by the following claims.

We claim:

1. A transport medium for in-process transportation of electrical devices comprising:
    (a) a plurality of carrier units for carrying at least one electrical device each, each carried electrical device being sufficiently exposed to enable processing of it while it is being carried in its respective carrier unit,
    (b) means for holding the plurality of carrier units in a generally coplanar relationship throughout the processing, the carrier units being held in fixed relation across the plane of said coplanar relationship but having a range normal to the plane within which the plurality of carrier units can freely travel,
    (c) means operable within the range of carrier unit travel for selectively conforming the plane of said coplanar relationship to a reference plane.

2. The transport medium according to claim 1 further comprising means integral with each carrier unit for exposing for processing the top and bottom of each electrical device carried by said each carrier unit.

3. The transport medium according to claim 1 wherein the means for holding the carrier units holds said carrier units uniformly oriented.

4. The transport medium according to claim 1 wherein the means for holding the carrier units comprises:
    (a) a tray, (b) a plurality of generally coplanar sockets defined by the tray in which the carrier units are disposed, (c) means for securing the carrier units in their respective sockets but allowing the carrier units to freely travel within a range normal to the plane of the sockets.

5. The transport medium according to claim 4 wherein the means for securing the carrier units in their respective sockets comprises:

(a) a plurality of elongated prongs projecting from a base of each carrier unit, each prong having a resiliently and radially collapsible barbed end, and (b) a plurality of corresponding catch holes defined by the tray, the size of each catch hole being less than the size of the uncollapsed barbed end of a corresponding prong but being large enough to allow passage therethrough of the collapsed barbed end so as to catch the barbed ends when the prong is inserted into the catch hole.

6. The transport medium according to claim 4 wherein the means for selectively conforming the plane of the coplanar relationship to a reference plane comprises means projecting to a uniform extent from each carrier unit for abutting against a reference surface.

7. The transport medium according to claim 4 wherein the carrier unit sockets are coordinately disposed to enable the carrier units disposed therein to be uniquely identifiable by a set of coordinates, and further comprising an indexing means for use by a process machine in locating each individual carrier unit according to its coordinates.

8. The transport medium according to claim 1 wherein each carrier unit further comprises:

(a) a perimeter which is uniform with the perimeters of the other carrier units, and (b) a core which is specially adapted to a particular electrical device size and form.

9. The transport medium according to claim 8 wherein the core further comprises:

(a) at least one electrical device seat in which an electrical device can be seated, (b) means for aligning a processing probe with each electrical device seated in the carrier unit, and (c) web means affixed to the carrier unit perimeter for holding said at least one electrical device seat and the means for aligning a processing probe in fixed relation to the core, any plurality of device seats being fixed in coplanar relationship.

10. The transport medium according to claim 9 wherein each electrical device seat comprises:

(a) a seat sleeve conforming to a marginal size and form of an electrical device which is seatable therein, (b) a stop means intruding into the seat sleeve for limiting the depth at which the electrical device is seated, and (c) a plurality of resiliently retractable hook means operatively opposed to the stop means for grasping the electrical device therebetween.

11. A transport medium for in-process transportation of electrical devices each having a set of electrical contacts, said medium comprising:

(a) a plurality of carrier units for carrying at least one electrical device each, the set of electrical contacts of each carried electrical device being sufficiently exposed to enable electrical parameter testing of the electrical device while it is being carried in its respective carrier unit, (b) means for holding the plurality of carrier units in a generally coplanar relationship throughout the processing with the exposures of the electrical contacts of the carried electrical devices being common to one face of the plane of said coplanar relationship, the carrier units being held in fixed relation across the plane but having a range normal to the plane within which the plurality of carrier units can freely travel, (c) means operable within the range of carrier unit travel for selectively conforming the face of the plane common to the contacts of the electrical devices to a reference plane.

12. The transport medium according to claim 11 wherein the means for holding the carrier units comprises:

(a) a tray, (b) a plurality of generally coplanar sockets defined by the tray in which the carrier units are disposed, (c) means for securing the carrier units in their respective sockets but allowing the carrier units to freely travel within a range normal to the plane of the sockets.

13. The transport medium according to claim 12 wherein the means for securing the carrier units in their respective sockets comprises:

(a) a plurality of elongated prongs projecting from a base of each carrier unit, each prong having a resiliently and radially collapsible barbed end, and (b) a plurality of corresponding catch holes defined by the tray, the size of each catch hole being less than the size of the uncollapsed barbed end of a corresponding prong but being large enough to allow passage therethrough of the collapsed barbed end so as to catch the barbed ends when the prong is inserted into the catch hole.

14. The transport medium according to claim 12 wherein the means for selectively conforming the plane of the coplanar relationship to a reference plane comprises means projecting to a uniform extent from each carrier unit for abutting against a reference surface.

15. The transport medium according to claim 12 wherein the carrier unit sockets are coordinately disposed to enable the carrier units disposed therein to be uniquely identifiable by a set of coordinates, and further comprising an indexing means for use by a process machine in locating each individual carrier unit according to its coordinates.

16. The transport medium according to claim 11 wherein each carrier unit further comprises:

(a) a perimeter which is uniform with the perimeters of the other carrier units, and (b) a core which is specially adapted to a particular electrical device size and form.

17. The transport medium according to claim 16 wherein the core further comprises:

(a) at least one electrical device seat in which an electrical device can be seated, (b) means for aligning a processing probe with each electrical device seated in the carrier unit, and (c) web means affixed to the carrier unit perimeter for holding said at least one electrical device seat and the means for aligning a processing probe in fixed relation to the core, any plurality of device seats being fixed in coplanar relationship.

18. The transport medium according to claim 17 wherein each electrical device seat comprises:

(a) a seat sleeve conforming to a marginal size and form of an electrical device which is seatable therein, (b) a stop means intruding into the seat sleeve for limiting the depth at which the electrical device is seated. and (c) a plurality of resiliently retractable hook means operatively opposed to the stop means for grasping the electrical device therebetween.

* * * * *